United States Patent [19]
Antone

[11] Patent Number: 5,602,505
[45] Date of Patent: Feb. 11, 1997

[54] GATE DRIVE CIRCUIT

[75] Inventor: James A. Antone, Peoria, Ill.

[73] Assignee: Caterpillar Inc., Peoria, Ill.

[21] Appl. No.: 603,702

[22] Filed: Feb. 20, 1996

Related U.S. Application Data

[63] Continuation of Ser. No. 330,455, Oct. 28, 1994, abandoned.

[51] Int. Cl.$^6$ .................................................. H03K 17/687
[52] U.S. Cl. ........................... 327/434; 327/376; 327/377; 327/421; 327/432; 327/365; 327/389; 327/442
[58] Field of Search ..................................... 327/427, 434, 327/317, 377, 376, 421, 432, 306, 365, 387, 388, 389, 442

[56] References Cited

U.S. PATENT DOCUMENTS

| | | | |
|---|---|---|---|
| 4,052,623 | 10/1977 | Loberg | 327/304 |
| 4,461,966 | 7/1984 | Hebenstreit | 327/432 |
| 4,469,962 | 9/1984 | Snyder | 327/203 |
| 4,511,815 | 4/1985 | Wood | 327/436 |
| 4,603,269 | 7/1986 | Hochstein | 327/432 |
| 4,710,645 | 12/1987 | Doittau et al. | 327/432 |
| 4,849,683 | 7/1989 | Flolid | 323/284 |
| 4,877,982 | 10/1989 | Walker | 327/434 |
| 4,893,211 | 1/1990 | Bynum et al. | 361/18 |
| 4,970,420 | 11/1990 | Billings | 327/430 |
| 5,008,771 | 4/1991 | Palara | 327/512 |
| 5,010,261 | 4/1991 | Steigerwald | 327/404 |
| 5,051,613 | 3/1991 | Houser, Jr. et al. | 327/544 |
| 5,068,553 | 11/1991 | Love | 327/262 |
| 5,134,320 | 7/1992 | Perusse | 327/382 |
| 5,195,007 | 3/1993 | Kikuchi et al. | 361/21 |
| 5,212,619 | 5/1993 | Baudelot et al. | 361/91 |
| 5,304,863 | 4/1994 | Cargille | 327/110 |
| 5,408,149 | 4/1995 | Aneha et al. | 327/427 |
| 5,434,527 | 7/1995 | Antone | 327/434 |

*Primary Examiner*—Timothy P. Callahan
*Assistant Examiner*—Dinh T. Le
*Attorney, Agent, or Firm*—David M. Masterson

[57] ABSTRACT

In one aspect of the present invention a gate drive circuit is disclosed. The gate drive circuit includes a high voltage and low voltage energy source, a power transistor, a switching transistor, and a charging capacitor. The charging capacitor stores energy from the low voltage energy source. The gate drive circuit further includes a circuit that biases the switching transistor OFF which causes the low voltage energy stored in the capacitor to bias the power transistor ON to transfer high voltage energy to the load. The circuit additionally biases the switching transistor ON which biases the power transistor OFF to block the transfer of high voltage energy. Finally, a protection device is included to limit the power transistor voltage to a maximum voltage level in response to the power transistor being biased ON.

6 Claims, 1 Drawing Sheet

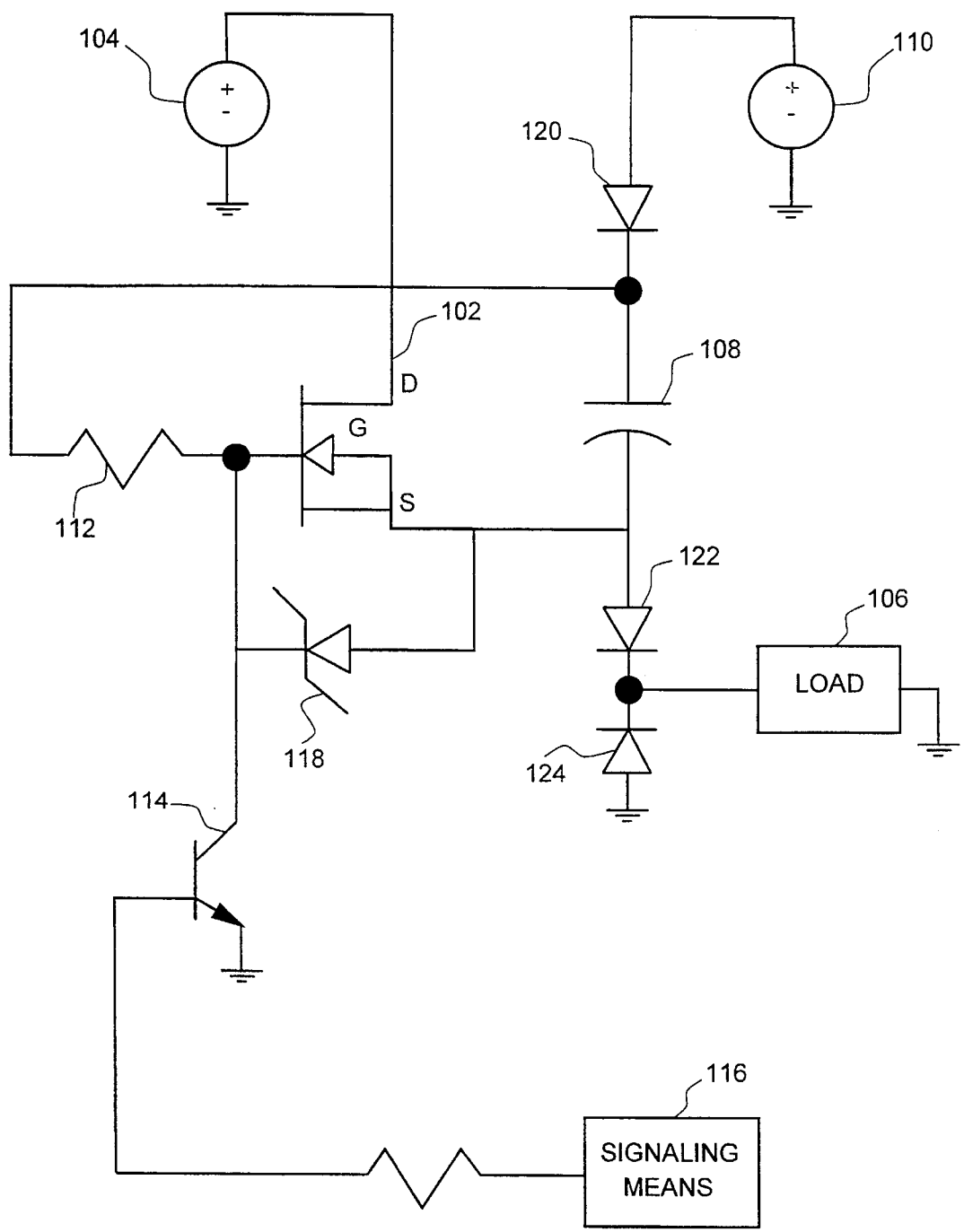
Fig_1_

GATE DRIVE CIRCUIT

This is a file wrapper continuation of application Ser. No. 08/330,455 filed Oct. 28, 1994, now abandoned.

TECHNICAL FIELD

This invention relates generally to a gate drive circuit for a transistor and, more particularly, to an gate drive circuit for a transistor that controls high voltage to a load.

BACKGROUND ART

Power transistors are commonly used to control high voltages and currents to a load. A power transistor may include a MOSFET or an Insulated Gate Bipolar Transistor (IGBT). Because a power transistor passes high voltage to a load, the MOSFET source may "float" over a voltage range from a low voltage to a high voltage. However, because the MOSFET gate must be biased with at least five volts greater than the source voltage, it becomes difficult to turn the power transistor ON.

To overcome the difficulty of turning ON the power transistor, several manufactures have used a transformer to control the power transistor bias. However a transformer is a costly circuit element. Moreover a transformer is bulky and radiates unwanted noise. Consequently such gate drive circuits are undesirable.

The present invention is directed to overcoming one or more of the problems as set forth above.

DISCLOSER OF THE INVENTION

In one aspect of the present invention a gate drive circuit is disclosed. The gate drive circuit includes a high voltage and low voltage energy source, a power transistor, a switching transistor, and a charging capacitor. The charging capacitor stores energy from the low voltage energy source. The gate drive circuit further includes a circuit that biases the switching transistor OFF which causes the low voltage energy stored in the capacitor to bias the power transistor ON to transfer high voltage energy to the load. The circuit additionally biases the switching transistor ON which biases the power transistor OFF to block the transfer of high voltage energy. Finally, a protection device is included to limit the power transistor voltage to a maximum voltage level in response to the power transistor being biased ON.

BRIEF DESCRIPTION OF THE DRAWINGS

For a better understanding of the present invention, reference may be made to the accompanying drawings in which:

FIG. 1 shows a gate drive circuit associated with a preferred embodiment of the present invention.

BEST MODE FOR CARRYING OUT THE INVENTION

Referring now to the drawings, wherein a preferred embodiment of the present invention is shown, FIG. 1 illustrates a gate drive circuit 100. The gate drive circuit 100 controls the state or bias of a power transistor 102. The power transistor 102 acts as a high voltage switch that regulates current from a high voltage energy source 104 to a load 106. For example, the high voltage energy source may produce 108 volts. The load may include resistor, capacitor, or a solenoid that is part of a fuel injector for an engine, for example. As shown, the power transistor drain is connected to the energy source 104, and the power transistor source is connected to the load 106. The power transistor 102 may be of MOSFET or IGBT construction, for example.

A charging capacitor 108 is connected through a low-current blocking diode 120 to a low-voltage energy source 110. The low voltage energy source 110 may produce 13 volts, for example. The energy stored in the charging capacitor 108 is used to bias the power transistor 102 ON via a charging resistor 112. The values of the charging capacitor 108 and resistor 112 determine the "turn-on" time of the power transistor 102.

A switching transistor 114 is connected between the power transistor gate and ground. The switching transistor is used to bias the power transistor 102 OFF. For example, the switching transistor may be of a small-signal, bi-polar construction.

A signaling means 116 is connected to the switching transistor 114 and is used to control the state of the switching transistor 114. For example, the signaling means 116 biases the switching transistor OFF to cause the low voltage energy stored in the capacitor to bias the power transistor ON through the charging resistor 112.

Alternately, the signaling means 116 biases the switching transistor ON to pull the power transistor gate to ground, which biases the power transistor OFF. Additionally, while the switching transistor if biased ON, the charging capacitor 108 is being "recharged" from the low voltage energy source 110. The signalling means 116 may include a microprocessor, oscillator, or the like.

A Zener diode 118 is connected between the power transistor gate and source, and may perform at least two functions.

First, the Zener diode 118 limits the power transistor gate to source voltage while the power transistor 102 is biased ON to protect the transistor from excessive voltages. Additionally, by limiting the gate to source voltage, the power transistor current is limited as well. For example, the Zener diode 118 sets the maximum gate to source voltage to a predetermined voltage level. Because the maximum gate to source voltage determines the maximum amount of current that may be passed through the transistor 102, the transistor current will be limited to a predetermined current level. Consequently, during a short circuit condition, the power transistor current will be limited to the predetermined current level to protect the transistor from excessive currents.

Second, the Zener diode 118 provides a current path to ground (when transistor 114 is biased ON) so that the charging capacitor 108 may store energy. Thus, the Zener diode effectively functions as a bi-directional switch. For example, biased one direction the Zener diode limits the power transistor voltage and current; biased in another direction the Zener diode provides for the charging capacitor 108 to store energy.

Diode 120 is connected between the low voltage power source 110 and the charging capacitor 108. The diode 120 is used to protect the low voltage power source 110 from damaging voltages. Diode 122 is connected between the charging capacitor 108 and the load 106 and is used to provide reverse battery protection. Finally, diode 124 is connected between the load 106 and ground and is used in a flyback current path for an inductive type load such as a solenoid. However, diode 124 is not required for a resistive or capacitive type load.

INDUSTRIAL APPLICABILITY

The operation of the present invention is now described.

Initially, the signaling means 116 delivers a "high" signal to the switching transistor 114, which responsively biases the switching transistor ON. Additionally, a current path develops from the low voltage power source 110 to ground, which charges the capacitor 108.

Once the signaling means 116 determines that the load is to receive electrical energy, the signaling means 116 delivers a "low" signal to the switching transistor 114, which responsively biases OFF and blocks the low voltage current path to ground. Consequently, the charging capacitor 108 discharges the stored energy through the power transistor gate to source. As the gate voltage increases, the power transistor turns ON, thereby passing the high voltage energy to the load. Note that, the power transistor gate remains approximately $+V_{zener}$ greater than the source, even though the source voltage floats from a low voltage to a high voltage.

To bias the power transistor OFF, the signaling means 116 delivers a "high" signal to the switching transistor 114, which effectively "shorts" the power transistor gate to ground. The power transistor 102 is then quickly biased OFF. Thus, the present invention provides for a fast turn-off mechanism due to the short time that is required to discharge the power transistor gate to source voltage to ground.

Other aspects, objects and advantages of the present invention can be obtained from a study of the drawings, the disclosure and the appended claims.

I claim:

1. A gate drive circuit, comprising:

a high voltage energy source;

a low voltage energy source;

an N-channel transistor having a drain connected to the high voltage energy source and a source connected to a load;

a switching transistor having a collector being connected to the N-channel transistor gate and an emitter being connected to ground;

a charging capacitor being connected between the low voltage energy source and the switching transistor collector to store energy from the low voltage energy source, the charging capacitor being additionally connected across the N-channel transistor gate and source to energize the gate at a predetermined voltage above the source with the stored energy;

signaling means being connected to the switching transistor for biasing the switching transistor OFF which causes the low voltage energy stored in the capacitor to bias the N-channel transistor ON to transfer high voltage energy to the load, and biasing the switching transistor ON which biases the N-Channel transistor OFF to block the transfer of high voltage energy; and means being connected between the N-channel transistor gate and source for limiting the N-channel transistor voltage to a maximum voltage level in response to the N-channel transistor being biased ON.

2. A circuit, as set forth in claim 1, including a Zener diode connected between the N-channel transistor gate and source, the Zener Diode limiting the N-channel transistor gate to source voltage and current, and providing a current path for the charging capacitor to store energy.

3. A circuit, as set forth in claim 2, including a charging resistor connected between the charging capacitor and the N-channel transistor gate, the resistor and the capacitor providing for a predetermined time period in which the N-channel transistor turns ON.

4. A circuit, as set forth in claim 1, wherein the switching transistor includes an NPN bipolar transistor.

5. A circuit, as set forth in claim 4, wherein the signaling means includes a microprocessor.

6. A circuit, as set forth in claim 5, wherein the load includes a solenoid.

\* \* \* \* \*